US012622202B2

(12) United States Patent
Lim

(10) Patent No.: US 12,622,202 B2
(45) Date of Patent: May 5, 2026

(54) SUBSTRATE PROCESSING APPARATUS

(71) Applicant: SEMES CO., LTD., Cheonan-si (KR)

(72) Inventor: Euisang Lim, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 78 days.

(21) Appl. No.: 18/537,661

(22) Filed: Dec. 12, 2023

(65) Prior Publication Data

US 2024/0213043 A1     Jun. 27, 2024

(30) Foreign Application Priority Data

Dec. 26, 2022    (KR) ........................ 10-2022-0185008

(51) Int. Cl.
| | |
|---|---|
| *H01L 21/67* | (2006.01) |
| *H01L 21/02* | (2006.01) |
| *H10P 70/00* | (2026.01) |
| *H10P 72/00* | (2026.01) |

(52) U.S. Cl.
CPC .......... *H10P 72/0408* (2026.01); *H10P 70/80* (2026.01); *H10P 72/0451* (2026.01); *H10P 70/20* (2026.01); *H10P 72/0414* (2026.01); *H10P 72/0462* (2026.01)

(58) Field of Classification Search
CPC ........ H01L 21/02101; H01L 21/67017–67086
See application file for complete search history.

(56) References Cited

U.S. PATENT DOCUMENTS

| | | | |
|---|---|---|---|
| 10,504,718 | B2 | 12/2019 | Ohno et al. |
| 10,576,493 | B2 | 3/2020 | Egashira et al. |
| 11,482,427 | B2 | 10/2022 | Kiyohara et al. |
| 2018/0138035 | A1* | 5/2018 | Ohno ................ H01L 21/67051 |
| 2018/0158676 | A1* | 6/2018 | Kiyohara .......... H01L 21/67017 |
| 2018/0254200 | A1* | 9/2018 | Kawabuchi ....... H01L 21/02057 |

(Continued)

FOREIGN PATENT DOCUMENTS

| | | |
|---|---|---|
| KR | 10-2005-0087059 A | 8/2005 |
| KR | 10-2013-0056758 A | 5/2013 |

(Continued)

OTHER PUBLICATIONS

Korean Office Action dated Jun. 27, 2024 issued in corresponding Korean Appln. No. 10-2022-0185008.

*Primary Examiner* — Kaj K Olsen
*Assistant Examiner* — Richard Z. Zhang
(74) *Attorney, Agent, or Firm* — Harness, Dickey & Pierce, P.L.C.

(57)     ABSTRACT

A substrate processing apparatus includes a first drying unit configured to perform a first drying process using a drying fluid on a substrate having a liquid film formed thereon, a first fluid supply unit configured to supply the drying fluid into the first drying unit, a second drying unit configured to perform a second drying process using the drying fluid on the substrate on which the first drying process is performed, a second fluid supply unit configured to supply the drying fluid into the second drying unit, a first door configured to control opening and closing of the first drying unit, and a second door configured to control opening and closing of the second drying unit, wherein the first door is opened when pressure in the first drying unit reaches a first transfer pressure, and the second door is opened when pressure in the second drying unit reaches a second transfer pressure.

18 Claims, 12 Drawing Sheets

(56) References Cited

U.S. PATENT DOCUMENTS

| | | | | |
|---|---|---|---|---|
| 2018/0264504 | A1* | 9/2018 | Egashira ........... | H01L 21/02101 |
| 2020/0047224 | A1* | 2/2020 | Fukui ................ | H01L 21/67017 |
| 2020/0098594 | A1* | 3/2020 | Kiyohara ......... | H01L 21/67034 |
| 2022/0044945 | A1* | 2/2022 | Umezaki ........... | H01L 21/67748 |
| 2022/0090859 | A1 | 3/2022 | Yoon et al. | |
| 2022/0165599 | A1* | 5/2022 | Kawahara ................ | B08B 3/08 |
| 2023/0290632 | A1* | 9/2023 | Goshi ............... | H01L 21/02057 |

FOREIGN PATENT DOCUMENTS

| | | | | |
|---|---|---|---|---|
| KR | 20130053108 | A | * | 5/2013 |
| KR | 10-2018-0105089 | A | | 9/2018 |
| KR | 10-2022-0037632 | A | | 3/2022 |
| KR | 10-2022-0093063 | A | | 7/2022 |
| KR | 10-2022-0094144 | A | | 7/2022 |
| KR | 10-2022-0134508 | A | | 10/2022 |
| WO | WO2020195474 | A1 | * | 10/2020 |
| WO | WO2024062799 | A1 | * | 3/2024 |

* cited by examiner

FIG. 6C

SUBSTRATE PROCESSING APPARATUS

CROSS-REFERENCE TO RELATED APPLICATION

This application is based on and claims priority under 35 U.S.C. § 119 to Korean Patent Application No. 10-2022-0185008, filed on Dec. 26, 2022, in the Korean Intellectual Property Office, the disclosure of which is incorporated by reference herein in its entirety.

BACKGROUND

1. Field

The disclosure relates to a substrate processing apparatus, and more particularly, to a substrate processing apparatus including a drying processing unit.

2. Description of the Related Art

In order to manufacture semiconductor devices, desired patterns are formed on substrates, such as wafers, through various processes such as photography, etching, ashing, ion implantation, and thin film deposition. Various processing liquids and processing gases are used in each process, and particles and process by-products are generated during the processes. In order to remove the particles and process by-products from the substrates, a cleaning process is performed before and after each process.

In general cleaning processes, the substrates are processed with chemicals and rinse liquids and then dried. As an example of drying processing, there are spin drying processes for removing rinse liquids remaining on substrates by spinning the substrates at a high speed. However, spin drying methods as described above may break patterns formed on the substrates.

Accordingly, recently, supercritical drying processes have been used to replace rinse liquids remaining on substrates with organic solvents having low surface tension by supplying the organic solvents, such as isopropyl alcohol (IPA), on the substrates, and then remove the organic solvents remaining on the substrates by supplying processing fluids in a supercritical state. In the supercritical drying processes, drying gases are supplied into process chambers having sealed insides, and the drying gases are heated and/or pressurized. Accordingly, both the temperature and pressure of the drying gases rise above a critical point, and the drying gases undergo phase changes to supercritical states.

SUMMARY

Provided is a substrate processing apparatus having improved drying performance.

An object of the disclosure is not limited to the above description, and other objects and advantages of the disclosure not mentioned may be understood by the following description.

Additional aspects will be set forth in part in the description which follows and, in part, will be apparent from the description, or may be learned by practice of the presented embodiments of the disclosure.

According to an aspect of the disclosure, a substrate processing apparatus includes a first drying unit configured to perform a first drying process using a drying fluid on a substrate having a liquid film formed thereon, a first fluid supply unit configured to supply the drying fluid into the first drying unit, a second drying unit configured to perform a second drying process using the drying fluid on the substrate on which the first drying process is performed, a second fluid supply unit configured to supply the drying fluid into the second drying unit, a first door configured to control opening and closing of the first drying unit, and a second door configured to control opening and closing of the second drying unit, wherein the first door is opened when pressure in the first drying unit reaches a first transfer pressure, and the second door is opened when pressure in the second drying unit reaches a second transfer pressure.

According to another aspect of the disclosure, a substrate processing apparatus includes a first drying unit configured to perform a first drying process using a drying fluid on a substrate having a liquid film formed thereon, a second drying unit configured to perform a second drying process using the drying fluid on the substrate on which the first drying process is performed, a waiting space adjacent to the first drying unit and the second drying unit, a waiting space adjacent to the first drying unit and the second drying unit, a first door configured to control opening and closing of the first drying unit, a second door configured to control opening and closing of the second drying unit, and a transfer apparatus configured to transfer, to the second drying unit, the substrate on which the first drying process is performed in the first drying unit, wherein the first door is opened when pressure in the first drying unit reaches a first transfer pressure, the second door is opened when pressure in the second drying unit reaches a second transfer pressure, and the first transfer pressure is lower than or equal to the second transfer pressure.

According to another aspect of the disclosure, a substrate processing method includes a liquid processing operation of cleaning a substrate, transporting the substrate to a drying processing unit, the drying processing unit including a first drying processing unit and a second drying processing unit, and a drying operation on the substrate, wherein the drying operation on the substrate includes a first boosting operation of boosting pressure to a first processing pressure in the first drying unit, a first drying operation of performing a first drying process on the substrate at the first processing pressure by using a drying fluid, a first decompression operation of reducing pressure to a first transfer pressure in the first drying unit, a transfer operation of transferring, from the first drying unit to the second drying unit, the substrate on which the first drying process is performed, a second boosting operation of boosting pressure to a second processing pressure in the second drying unit, and a second drying operation of performing, at the second processing pressure, a second drying process on the substrate on which the first drying process is performed, by using the drying fluid.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 6A to 6C are views illustrating a process of operating some components of a substrate processing apparatus, according to an embodiment;

DETAILED DESCRIPTION

Figure 1:
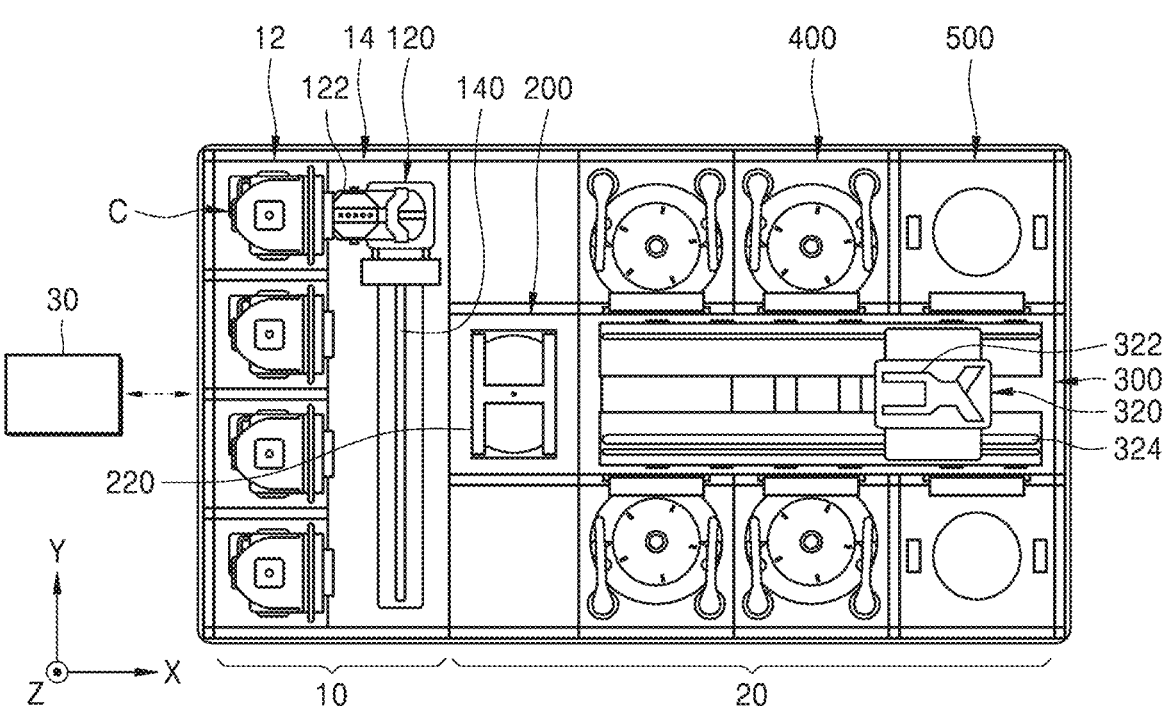
FIG. 1 is a plan view schematically illustrating a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings so that those of ordinary skill in the art may easily implement the embodiments. The disclosure may be implemented in various different forms and is not limited to embodiments described herein.

In order to clearly describe the disclosure, parts unrelated to the description will be omitted, and the same or similar components are denoted by the same reference numerals throughout the description.

In addition, in various embodiments, components having the same structure will be described only in representative embodiments by using the same reference numerals, and only components different from the representative embodiments will be described in other embodiments.

As used herein, when a part is referred to as being "connected" to another part, it may be "directly connected or coupled" to the other part or may be "indirectly connected or coupled" to the other part via intervening elements. In addition, when a part "includes" a component, it means that it may include more components rather than exclude other components unless specifically stated otherwise.

Unless otherwise defined, all terms (including technical and scientific terms) used herein have the same meaning as commonly understood by those of ordinary skill in the art to which embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view schematically illustrating a substrate processing apparatus according to an embodiment.

Referring to FIG. 1, the substrate processing apparatus includes an index module 10, a processing module 20, and a controller 30. When viewed from above, the index module 10 and the processing module 20 are arranged in one direction. Hereinafter, the direction in which the index module 10 and the processing module 20 are arranged is referred to as a first direction X, when viewed from above, a direction perpendicular to the first direction X is referred to as a second direction Y, and a direction perpendicular to both the first direction X and the second direction Y is referred to as a third direction Z.

The index module 10 returns a substrate W from a container C accommodating the substrate W to the processing module 20, and accommodates the substrate W, which is completely processed by the processing module 20, into the container C. A longitudinal direction of the index module 10 is provided in the second direction Y. The index module 10 has a load port 12 and an index frame 14. The load port 12 is located on the opposite side of the processing module 20 on the basis of the index frame 14. The container C accommodating the substrates W is placed in the load port 12. A plurality of load ports 12 may be provided, and the plurality of load ports 12 may be arranged in the second direction Y.

A closed container, such as a front open unified pod (FOUP), may be used as the container C. The container C may be placed in the load port 12 by a transport unit (not shown), such as an overhead transfer, an overhead conveyor, or an automatic guided vehicle, or by a worker.

An index robot 120 is provided in the index frame 14. A guide rail 140 having a longitudinal direction provided in the second direction Y is provided within the index frame 14, and the index robot 120 may be provided to move on the guide rail 140. The index robot 120 includes a hand 122 on which the substrate W is placed, and the hand 122 may be provided to move forward and backward, pivot on an axis in the third direction Z, and move in the third direction Z. A plurality of hands 122 may be provided to be spaced apart from each other in a vertical direction, and the hands 122 may move forward and backward independently of each other.

The controller 30 may control the substrate processing apparatus. The controller 30 may include a process controller including a microprocessor (a computer) that controls the substrate processing apparatus, a user interface including a keyboard for an operator to perform a command input operation and the like to manage the substrate processing apparatus, a display for visualizing and displaying an operation status of the substrate processing apparatus, or the like, and a storage unit for storing a control program for executing processing executed in the substrate processing apparatus under the control of the process controller or a program for executing processing in each component according to various types of data and processing conditions, i.e., a processing recipe. In addition, the user interface and the storage unit may be connected to the process controller. The processing recipe may be stored in a storage medium of the storage unit, and the storage medium may be a hard disk, a portable disk such as CD-ROM or DVD, or a semiconductor memory such as a flash memory.

The processing module 20 includes a buffer unit 200, a transport apparatus 300, a liquid processing unit 400, and a drying processing unit 500. The buffer unit 200 provides a space in which the substrate W carried into the processing module 20 and the substrate W carried out from the processing module 20 temporarily stay. The liquid processing unit 400 performs a liquid processing process of liquid processing the substrate W by supplying liquid onto the substrate W. The drying processing unit 500 performs a drying processing process for removing the liquid remaining on the substrate W. The transport apparatus 300 transports the substrate W between the buffer unit 200, the liquid processing unit 400, and the drying processing unit 500.

In some embodiments, the liquid processing process performed in the liquid processing unit 400 may include a process of applying a cleaning solvent and an organic solvent to the substrate W, and the drying processing process performed in the drying processing unit 500 may include a process of removing the organic solvent.

The transport apparatus 300 may have a longitudinal direction provided in the first direction X. The buffer unit 200 may be arranged between the index module 10 and the transport apparatus 300. The liquid processing unit 400 and the drying processing unit 500 may be arranged on a side of the transport apparatus 300. The liquid processing unit 400 and the transport apparatus 300 may be arranged in the second direction Y. The drying processing unit 500 and the transport apparatus 300 may be arranged in the second direction Y. The buffer unit 200 may be located at one end of the transport apparatus 300.

According to an example, the liquid processing units 400 may be arranged on both sides of the transport apparatus 300, the dry processing units 500 may be arranged on both sides of the transport apparatus 300, and the liquid processing units 400 may be arranged closer to the buffer unit 200 than the dry processing units 500. On one side of the transport apparatus 300, the liquid processing units 400 may be provided in an array of A X B (wherein A and B are each 1 or a natural number greater than 1) in the first direction X and the third direction Z, respectively. In addition, on one side of the transport apparatus 300, C X D drying processing units 500 (wherein C and D are each 1 or a natural number greater than 1) may be provided in the first direction X and the third direction Z, respectively. Unlike the above description, only the liquid processing units 400 may be provided on one side of the transport apparatus 300, and only the drying processing units 500 may be provided on the other side of the transport apparatus 300.

The transport apparatus 300 has a transport robot 320. A guide rail 324 having a longitudinal direction provided in the first direction X is provided within the transport apparatus 300, and the transport robot 320 may be provided to move on the guide rail 324. The transport robot 320 includes a hand 322 on which the substrate W is placed, and the hand 322 may be provided to move forward and backward, pivot on an axis in the third direction Z, and move in the third direction Z. A plurality of hands 322 may be provided to be spaced apart from each other in the vertical direction, and the hands 322 may move forward and backward independently of each other.

The buffer unit 200 includes a plurality of buffers 220 on which the substrate W is placed. The buffers 220 may be arranged to be spaced apart from each other in the third direction Z. The buffer unit 200 has a front face and a rear face that are opened. The front face is a face facing the index module 10, and the rear face is a face facing the transport apparatus 300. The index robot 120 may approach the buffer unit 200 through the front face, and the transport robot 320 may approach the buffer unit 200 through the rear face.

Figure 2:
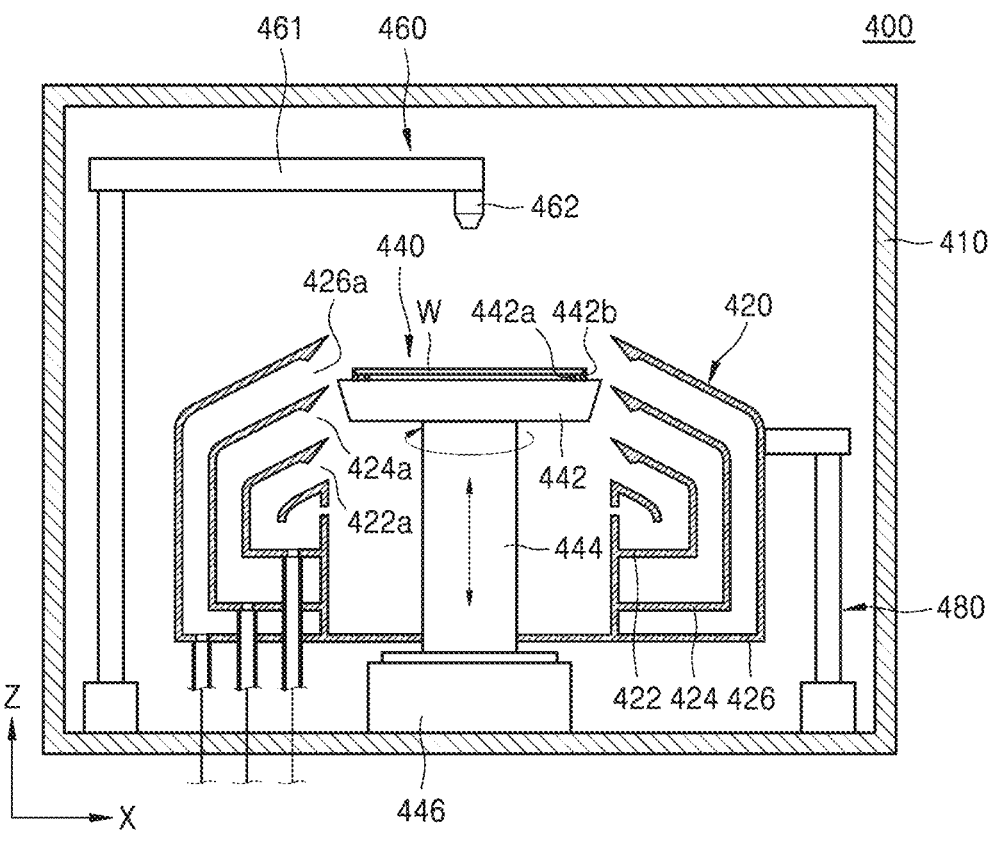
FIG. 2 is a view schematically illustrating an embodiment of a liquid processing unit of FIG. 1.

FIG. 2 is a view schematically illustrating an embodiment of the liquid processing unit 400 of FIG. 1.

Referring to FIG. 2, the liquid processing unit 400 has a housing 410, a cup 420, a support unit 440, a liquid supply unit 460, and a lifting unit 480.

The housing 410 may have an inner space in which the substrate W is processed. The housing 410 may have a substantially hexahedral shape. For example, the housing 410 may have a rectangular parallelepiped shape. Also, the housing 410 may have formed therein an opening (not shown) through which the substrate W is carried in or taken out. In addition, the housing 410 may have installed therein a door (not shown) for selectively opening and closing the opening.

The cup 420 may have a cylindrical shape with an open top. The cup 420 may have a processing space, and the substrate W may be liquid-processed within the processing space. The support unit 440 supports the substrate W in the processing space. The liquid supply unit 460 supplies a processing liquid onto the substrate W supported by the support unit 440. A plurality of types of processing liquids may be provided and sequentially supplied onto the substrate W. The lifting unit 480 adjusts a relative height between the cup 420 and the support unit 440.

According to an example, the cup 420 has a plurality of recovery containers 422, 424, and 426. Each of the recovery containers 422, 424, and 426 has a recovery space for recovering liquid used for substrate processing. Each of the recovery containers 422, 424, and 426 is provided in a ring shape surrounding the support unit 440. When a liquid processing process is performed, processing liquid, which is scattered by the rotation of the substrate W, flows into the recovery spaces through inlets 422a, 424a, and 426a of the recovery containers 422, 424, and 426. According to an example, the cup 420 has a first recovery container 422, a second recovery container 424, and a third recovery container 426. The first recovery container 422 is arranged to surround the support unit 440, the second recovery container 424 is arranged to surround the first recovery container 422, and the third recovery container 426 is arranged to surround the second recovery container 424. A second inlet 424a through which liquid flows into the second recovery container 424 may be located above a first inlet 422a through which the liquid flows into the first recovery container 422, and a third inlet 426a through which the liquid flows into the third recovery container 426 may be located above the second inlet 424a.

The support unit 440 has a support plate 442 and a driving shaft 444. A top surface of the support plate 442 may be provided in a substantially circular shape, and may have a greater diameter than the substrate W. A support pin 442a for supporting a rear surface of the substrate W is provided at a central portion of the support plate 442, and the support pin 442a has a top end provided to protrude from the support plate 442 so that the substrate W is spaced apart from the support plate 442 by a certain distance. A chuck pin 442b is provided at an edge portion of the support plate 442. The chuck pin 442b is provided to protrude upwards from the support plate 442, and supports a side portion of the substrate W to prevent the substrate W from being separated from the support unit 440 when the substrate W is rotated. The driving shaft 444 is driven by a driver 446, is connected to the center of a bottom surface of the substrate W, and rotates the support plate 442 on the basis of a central axis thereof.

According to an example, the liquid supply unit 460 may include a nozzle 462. The nozzle 462 may supply processing liquid to the substrate W. The processing liquid may be a chemical, rinse liquid, or an organic solvent. The chemical may be a chemical having the properties of a strong acid or a strong base. Also, the rinse liquid may be pure. In addition, the organic solvent may be isopropyl alcohol (IPA). In addition, the liquid supply unit 460 may include a plurality of nozzles 462, and the respective nozzles 462 may supply different types of processing liquid. For example, one of the nozzles 462 may supply a chemical, another one of the nozzles 462 may supply rinse liquid, and another one of the nozzles 462 may supply an organic solvent. In addition, the controller 30 may control the liquid supply unit 460 to supply the rinse liquid to the substrate W from another one of the nozzles 462 and then supply the organic solvent from another one of the nozzles 462. Accordingly, the rinse liquid supplied onto the substrate W may be substituted with an organic solvent having low surface tension.

The lifting unit 480 moves the cup 420 in the vertical direction. The relative height between the cup 420 and the substrate W is changed by the vertical movement of the cup 420. Accordingly, the recovery containers 422, 424, and 426 for recovering the processing liquid are changed according to a type of liquid supplied to the substrate W, and thus, the liquids may be separated and recovered. Unlike the above description, the cup 420 may be fixedly installed, and the lifting unit 480 may move the support unit 440 in the vertical direction.

Figure 3:
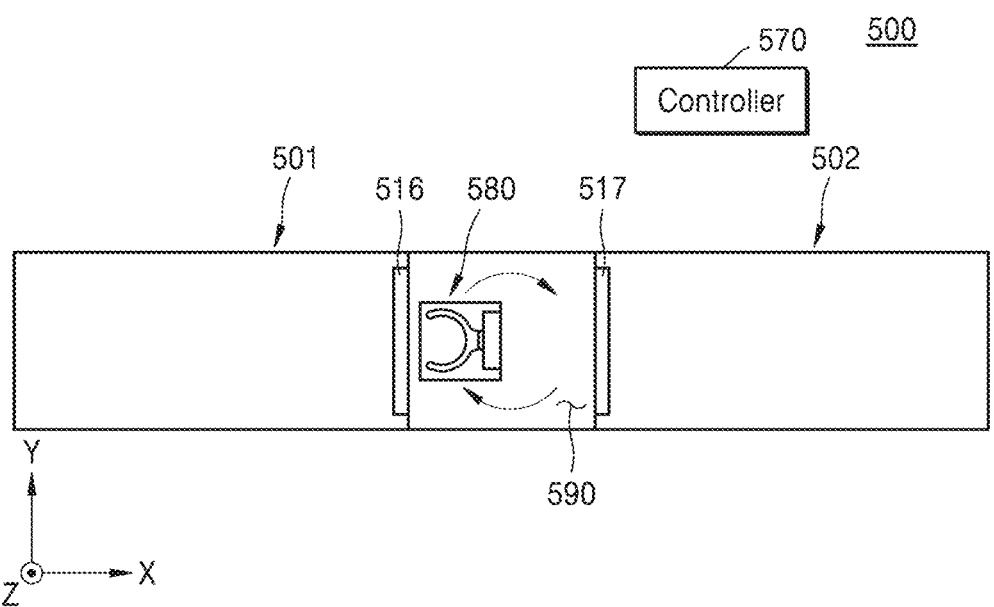
FIG. 3 is a view schematically illustrating an embodiment of a drying processing unit of FIG. 1.

FIG. 3 is a view schematically illustrating an embodiment of the drying processing unit of FIG. 1. The drying processing unit 500 according to an embodiment may remove processing liquid remaining on a substrate by using a drying fluid in a supercritical state. For example, the drying processing unit 500 may perform a drying processing process for removing an organic solvent remaining on the substrate by using carbon dioxide ($CO_2$) in a supercritical state.

In some embodiments, the drying processing unit 500 may include a first drying unit 501 and a second drying unit 502 arranged in a first direction X. Although not illustrated, the first drying unit 501 and the second drying unit 502 may be arranged in the first direction X, and may be adjacent to each other in the first direction X.

In some embodiments, the drying processing unit 500 may include a waiting space 590 arranged adjacent to the first drying unit 501 and the second drying unit 502. In some embodiments, the waiting space 590 may be arranged between the first drying unit 501 and the second drying unit 502. For example, the waiting space 590 may be arranged in a line with the first drying unit 501 and the second drying unit 502 in the first direction X, between the first drying unit 501 and the second drying unit 502. In some embodiments, the drying processing unit 500 may include a transfer apparatus 580 arranged in the waiting space 590. The transfer apparatus 580 may transfer, to the second drying unit 502, the substrate on which a first drying process is completed in the first drying unit 501. The detailed description thereof will be given below.

In some embodiments, the drying processing unit 500 may include a first door 516 arranged on one side of the first drying unit 501 and a second door 517 arranged on one side of the second drying unit 502. In some embodiments, the first door 516 may be arranged on one side of the first drying unit 501 adjacent to the waiting space 590, and may mediate the transfer of the substrate between the first drying unit 501 and the waiting space 590. In some embodiments, the second door 517 may be arranged on one side of the second drying unit 502 adjacent to the waiting space 590, and may mediate the transfer of the substrate between the second door 517 and the waiting space 590. The detailed description thereof will be given below.

In some embodiments, a drying processing controller 570 for controlling the drying processing unit 500 may be included. For example, the drying processing controller 570 may control the first drying unit 501 and the second drying unit 502. For example, the drying processing controller 570 may control the first door 516 and the second door 517. In some embodiments, the drying processing controller 570 may control separate controllers for controlling the first drying unit 501 and the second drying unit 502, respectively.

Figure 4:
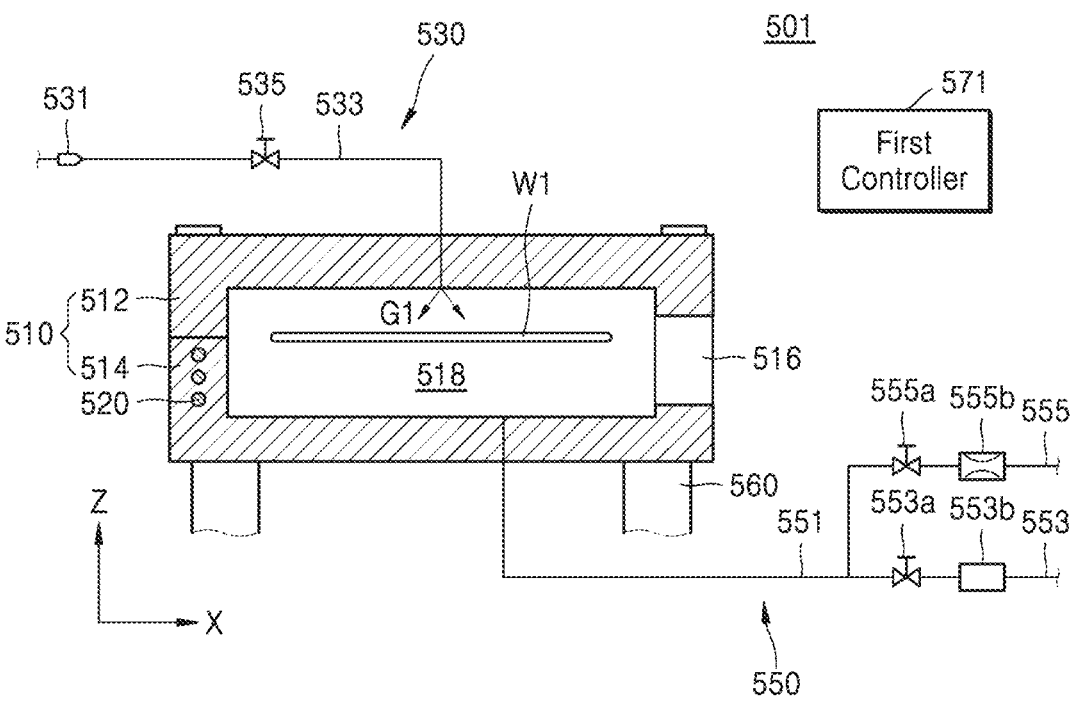
FIGS. 4 and 5 are views schematically illustrating some components of the drying processing unit of FIG. 3.
Figure 5:
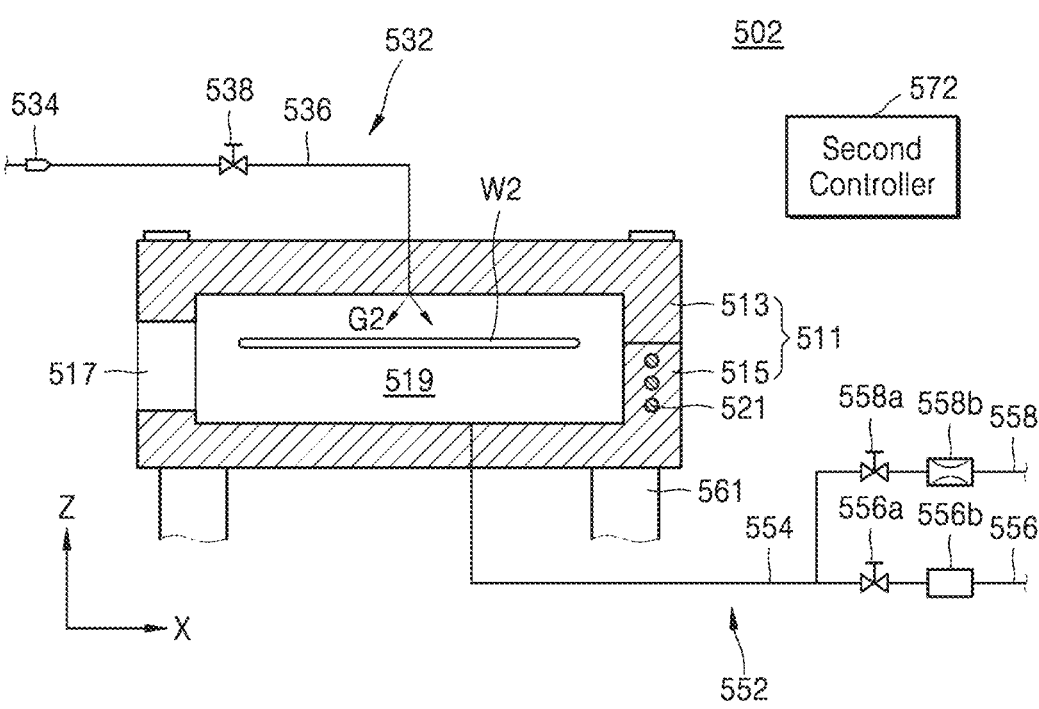

For example, the drying processing controller 570 may control a first controller 571 of FIG. 4 for controlling the first drying unit 501 and/or a second controller 572 of FIG. 5 for controlling the second drying unit 502. The drying processing controller 570 may include the first controller 571 for controlling the first drying unit 501 and/or the second controller 572 for controlling the second drying unit 502.

FIGS. 4 and 5 are views schematically illustrating some components of the drying processing unit 500 of FIG. 3. In detail, FIG. 4 is a view schematically illustrating components of a first drying unit 501. In detail, FIG. 5 is a view schematically illustrating components of a second drying unit 502.

Referring to FIG. 4, the first drying unit 501 may include a first body 510, a first door 516, a first heating unit 520, a first fluid supply unit 530, a first fluid exhaust unit 550, and a first lifting unit 560. The first body 510 may have a first inner space 518 in which a substrate having a liquid film formed thereon W1 is processed. The first body 510 may provide the first inner space 518 in which the substrate having a liquid film formed thereon W1 is dry processed by a first drying fluid G1 in a supercritical state.

In some embodiments, the first body 510 may include a first upper body 512 and a first lower body 514. The first upper body 512 and the first lower body 514 may be combined with each other to form the first inner space 518. The substrate W1 may be supported in the first inner space 518. For example, the substrate W1 may be supported by a support unit (not shown) in the first inner space 518. The support unit may be configured to support a bottom surface of an edge region of the substrate W1. Any one of the first upper body 512 and the first lower body 514 may be coupled to the first lifting unit 560 and may be moved in a vertical direction. For example, the first lower body 514 may be coupled to the first lifting member 560 and may be moved in the vertical direction by the first lifting unit 560. Accordingly, the first inner space 518 of the first body 510 may be selectively sealed. In the example described above, the first lower body 514 is coupled to the first lifting unit 560 and moves in the vertical direction, but is not limited thereto. For example, the first upper body 512 may also be coupled to the first lifting unit 560 to move in the vertical direction.

In some embodiments, the first door 516 may be arranged on one sidewall of the first body 510 to open and close the first drying unit 501. In detail, the first door 516 may be arranged on one sidewall of the first body 510 to open and close the first body 510. The first door 516 may be closed while a first drying process is performed in the first drying unit 501, and then may be opened when the first drying process is completed. For example, the first door 516 may be closed while the first drying process is performed in the first drying unit 501, and then may be opened when pressure of the first inner space 518 of the first body 510 reaches certain pressure. For example, when the pressure of the first inner space 518 of the first body 510 reaches a first transfer pressure, the first door 516 may be opened. In some embodiments, the first door 516 may include a slide door. For example, the first door 516 may include a slide door that opens and closes vertically or horizontally. In some embodiments, a substrate on which the first drying process is performed W2 may be transferred through the first door 516. For example, the substrate on which the first drying process is performed W2 may be transferred through the first door 516 to the waiting space 590 described with reference to FIG. 3.

In some embodiments, the first heating unit 520 may heat the first drying fluid G1 supplied to the first inner space 518.

For example, the first heating unit 520 may phase-change the first drying fluid G1, which is supplied to the first inner space 518, to a supercritical state by increasing a temperature of the first inner space 518 of the first body 510. Alternatively, the first heating unit 520 may allow the first drying fluid G1 in the supercritical state supplied to the first inner space 518 to maintain the supercritical state by increasing the temperature of the first inner space 518 of the first body 510.

In addition, the first heating unit 520 may be buried in the first body 510. For example, the first heating unit 520 may be buried in any one of the first upper body 512 and the first lower body 514. For example, the first heating unit 520 may be provided within the first lower body 514. However, the first heating unit 520 is not limited thereto, and may be provided at various positions capable of increasing the temperature of the first inner space 518. In addition, the first heating unit 520 may be a heater. However, the first heating unit 520 is not limited thereto, may be variously modified as a known apparatus capable of increasing the temperature of the first inner space 518.

In some embodiments, the first fluid supply unit 530 may supply the first drying fluid G1 to the first inner space 518 of the first body 510. The first drying fluid G1 supplied by the first fluid supply unit 530 may include carbon dioxide ($CO_2$). The first fluid supply unit 530 may include a first fluid supply source 531, a first supply line 533, and a first supply valve 535.

The first fluid supply source 531 may store and/or supply the first drying fluid G1 supplied to the first inner space 518 of the first body 510. The first fluid supply source 531 may supply the first drying fluid G1 to the first supply line 533. For example, the first supply valve 535 may be installed at the first supply line 533. The first supply valve 535 may be an on/off valve. When the first supply valve 535 is turned on/off, the first drying fluid G1 may selectively flow through the first supply line 533.

In the example described above, the first supply line 533 is connected to one first fluid supply source 531, but is not limited thereto. For example, a plurality of first fluid sources 531 and a plurality of first supply lines 533 may be provided, any one of the first supply lines 533 may be connected to any one of the plurality of fluid sources 531, and another one of the first supply lines 533 may be connected to another one of the plurality of fluid sources 531.

In some embodiments, the first supply line 533 may be an upper supply line for supplying the first drying fluid G1 from above the first inner space 518 of the first body 510. For example, the first supply line 533 may supply the first drying fluid G1 to the first inner space 518 of the first body 510 in a direction from top to bottom. For example, the first supply line 533 may be connected to the first upper body 512. In some embodiments, the first supply line 533 may be a lower supply line for supplying the first drying fluid G1 under the first inner space 518 of the first body 510. For example, the first supply line 533 may supply the first drying fluid G1 to the first inner space 518 of the first body 510 in a direction from bottom to top. For example, the first supply line 533 may be connected to the first lower body 514. Although not illustrated, a plurality of first supply lines 533 may be provided, any one of the plurality of first supply lines 533 may be an upper supply line, and the other one may be a lower supply line.

In some embodiments, the first fluid supply unit 530 may control the pressure of the first inner space 518 of the first body 510. For example, the first fluid supply unit 530 may boost the pressure of the first inner space 518 of the first body 510 by supplying the first drying fluid G1 to the first inner space 518 of the first body 510. For example, the first fluid supply unit 530 may maintain the pressure of the first inner space 518 of the first body 510 by controlling the supply of the first drying fluid G1.

In some embodiments, the first fluid exhaust unit 550 may exhaust the first drying fluid G1 from the first inner space 518 of the first body 510. The first fluid exhaust unit 550 may include, for example, a first exhaust line 551, a first flow line 553, and/or a first vent line 555. Components of the first fluid exhaust unit 550 are not limited thereto.

In some embodiments, the first exhaust line 551 may be connected to the first body 510. The first exhaust line 551 may exhaust the first drying fluid G1 supplied to the first inner space 518 of the first body 510 to the outside of the first body 510. For example, one end of the first exhaust line 551 may be connected to the first body 510. One end of the first exhaust line 551 may be connected to any one of the first upper body 512 and the first lower body 514. For example, one end of the first exhaust line 551 may be connected to the first lower body 514. In addition, the other end of the first exhaust line 551 may be branched. For example, lines branched from the first exhaust line 551 may include the first flow line 553 and the first vent line 555.

In some embodiments, the first flow line 553 may branch from the other end of the first exhaust line 551. The first flow line 553 may have installed thereon a first exhaust valve 553a and a first pressure controller 553b. The first exhaust valve 553a may be installed upstream of the first pressure controller 553b. The first exhaust valve 553a may be an on/off valve. The first exhaust valve 553a may allow the first drying fluid G1 to selectively flow through the first exhaust line 551.

In addition, the first pressure controller 553b may maintain the pressure of the first inner space 518 of the first body 510 constant at set pressure. For example, the first pressure controller 553b may measure pressure of the first drying fluid G1 flowing through the first exhaust line 551. In addition, the first pressure controller 553b may measure the pressure of the first inner space 518 of the first body 510 on the basis of the pressure of the first drying fluid G1 flowing through the first exhaust line 551. For example, the first pressure controller 553b may control an exhaust flow rate of the first drying fluid G1 per unit time exhausted through the first flow line 553 to maintain the pressure of the first inner space 518 of the first body 510 at the set pressure.

In some embodiments, the first vent line 555 may branch from the other end of the first exhaust line 551. The first vent line 555 may lower the pressure of the first inner space 518 of the first body 510. The first vent line 555 may have installed thereon a second exhaust valve 555a and a first vent line orifice 555b. The second exhaust valve 555a may be installed upstream of the first vent line orifice 555b. The second exhaust valve 555a may be an on/off valve.

As illustrated in the present embodiment, the pressure of the first inner space 518 of the first body 510 is maintained and reduced by the first flow line 553 and the first vent line 555, but is not limited thereto and may be controlled only by the first vent line 555. In other words, the pressure of the first inner space 518 of the first body 510 may be maintained and reduced only by the first vent line 555.

In some embodiments, the first controller 571 for controlling the first drying unit 501 may be further included. The first controller 571 may be a portion of the drying processing controller 570 described with reference to FIG. 3. In detail, the first controller 571 may control the pressure of the first inner space 518 of the first body 510 of the first drying unit 501. In more detail, the first controller 571 may boost, maintain, or lower the pressure of the first inner space 518 of the first body 510 of the first drying unit 501 to the set pressure. For example, the first controller 571 may control the first fluid supply unit 530 and/or the first fluid exhaust unit 550 to boost, maintain, or lower the pressure of the first inner space 518 of the first body 510 of the first drying unit 501 to the set pressure. In detail, the first controller 571 may control the first door 516 to open the first door 516 when the first drying process in the first drying unit 501 is completed. For example, when the pressure of the first inner space 518 of the first body 510 of the first drying unit 501 reaches the first transfer pressure, the first controller 571 may open the first door 516.

Referring to FIG. 5, the second drying unit 502 may include similar components to the first drying unit 501 described with reference to FIG. 4. For example, the second drying unit 502 may include a second body 511, a second door 517, a second heating unit 521, a second fluid supply unit 532, a second fluid exhaust unit 552, and a second lifting unit 561.

In some embodiments, the second body 511 may have a second inner space 519 in which the substrate on which a first drying process is performed W2 is processed. The second body 511 may provide the second inner space 519 in which the substrate on which the first drying process is performed W2 is dry processed by a second drying fluid G2 in a supercritical state.

In some embodiments, the second body 511 may include a second upper body 513 and a second lower body 515. The second upper body 513 and the second lower body 515 may be combined with each other to form the second inner space 519. Any one of the second upper body 513 and the second lower body 515 may be coupled to the second lifting unit 561, and may be moved in a vertical direction.

In some embodiments, the second door 517 may be arranged on one sidewall of the second body 511 to open and close the second drying unit 502. In detail, the second door 517 may be arranged on one sidewall of the second body 511 to open and close the second body 511. The second door 517 may be closed while the first drying process is performed in the first drying unit 501, and then may be opened when the first drying process is completed. For example, the second door 517 may be closed while the first drying process is performed within the first drying unit 501, and may be opened when pressure of the second inner space 519 of the second body 511 of the second drying unit 502 reaches a second transfer pressure. In some embodiments, the second door 517 may include a slide door. For example, the second door 517 may include a slide door that opens and closes vertically or horizontally. In some embodiments, the substrate on which the first drying process is performed W2 may be transferred through the second door 517. For example, the substrate on which the first drying process is performed W2 may be transferred from the waiting space 590 to the second drying unit 502 through the second door 517.

In some embodiments, the second heating unit 521 may heat the second drying fluid G2 supplied to the second inner space 519.

In some embodiments, the second fluid supply unit 532 may supply the second drying fluid G2 to the second inner space 519 of the second body 511. The second drying fluid G2 supplied by the second fluid supply unit 532 may include carbon dioxide ($CO_2$). The second fluid supply unit 532 may include a second fluid supply source 534, a second supply line 536, and a second supply valve 538.

In some embodiments, the second fluid supply unit 532 may control the pressure of the second inner space 519 of the second body 511. For example, the second fluid supply unit 532 may boost the pressure of the second inner space 519 of the second body 511 by supplying the second drying fluid G2 to the second inner space 519 of the second body 511. For example, the second fluid supply unit 532 may maintain the pressure of the second inner space 519 of the second body 511 by adjusting the supply of the second drying fluid G2.

In some embodiments, the second fluid exhaust unit 552 may exhaust the second drying fluid G2 from the second inner space 519 of the second body 511. The second fluid exhaust unit 552 may include, for example, a second exhaust line 554, a second flow line 556, and/or a second vent line 558. Components of the second fluid exhaust unit 552 are not limited thereto.

In some embodiments, the second fluid exhaust unit 552 may control the pressure of the second inner space 519 of the second body 511. For example, the second fluid supply unit 532 may lower the pressure of the second inner space 519 of the second body 511 by exhausting the second drying fluid G2 from the second inner space 519 of the second body 511. For example, the second fluid exhaust unit 552 may maintain the pressure of the second inner space 519 of the second body 511 by controlling the exhaust of the second drying fluid G2.

In some embodiments, the second controller 572 for controlling the second drying unit 502 may be further included. The second controller 572 may be a portion of the drying processing controller 570 described with reference to FIG. 3. In detail, the second controller 572 may control the pressure of the second inner space 519 of the second body 511 of the second drying unit 502. In more detail, the second controller 572 may boost, maintain, or lower the pressure of the second inner space 519 of the second body 511 of the second drying unit 502 to set pressure. For example, the second controller 572 may control the second fluid supply unit 532 and/or the second fluid exhaust unit 552 to boost, maintain, or lower the pressure of the second inner space 519 of the second body 511 of the second drying unit 502 to the set pressure. In detail, the second controller 572 may control the second door 517 to open the second door 517 when a second drying process in the second drying unit 502 is completed. For example, when the pressure of the second inner space 519 of the second body 511 of the second drying unit 502 reaches a second transfer pressure, the second controller 572 may open the second door 517.

As illustrated herein, the first controller 571 controls the first drying unit 501, and the second controller 572 controls the second drying unit 502, but one controller may control both the first drying unit 501 and the second drying unit 502.

Figure 6A:
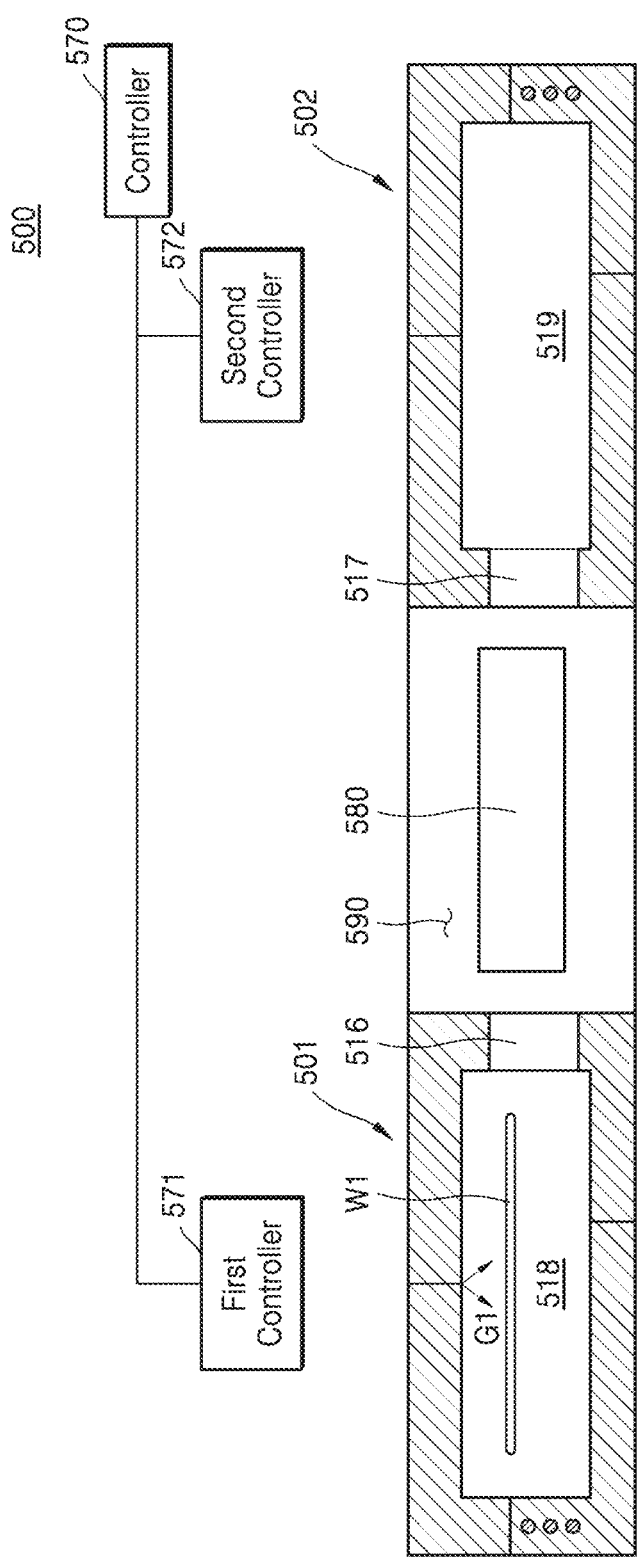
Figure 6B:
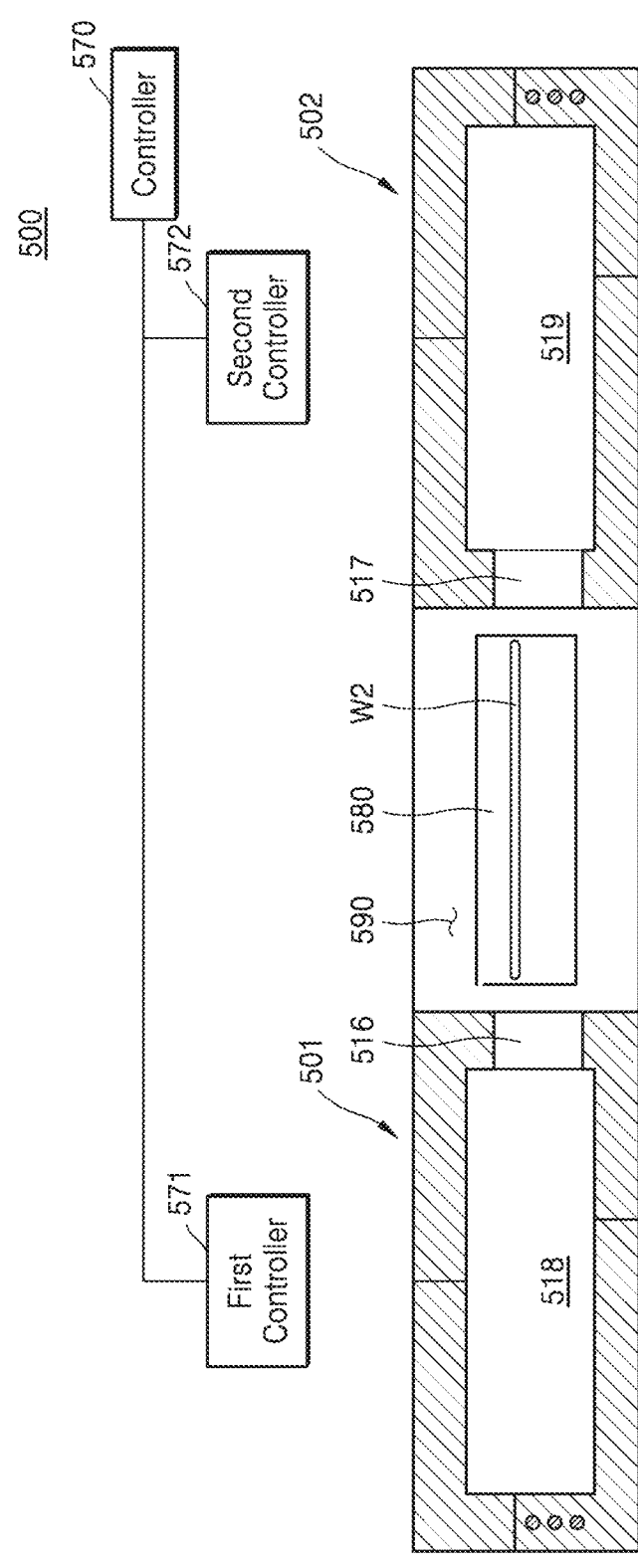
Figure 6C:
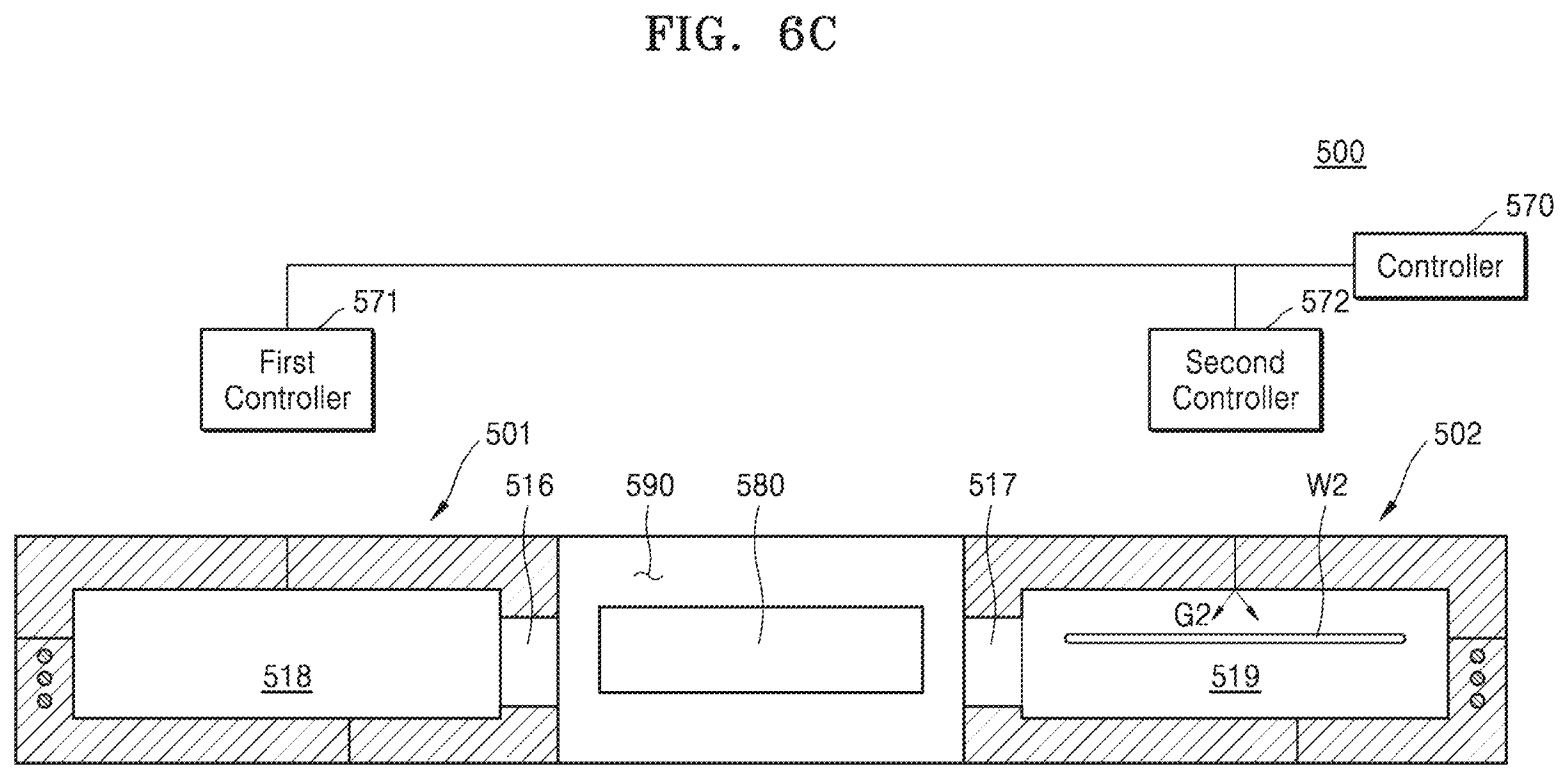

FIGS. 6A to 6C are views illustrating a process of operating a substrate processing apparatus, according to an embodiment.

Referring to FIGS. 6A to 6C, a drying processing unit 500 may perform a drying process on a substrate. In detail, the drying process may include a first drying process performed in a first drying unit 501 and a second drying process performed in a second drying unit 502.

In some embodiments, the first drying unit 501 may perform the first drying process on a substrate W1. In detail, the first drying unit 501 may perform the first drying process on the substrate having a liquid film formed thereon W1. The first drying process may use a first drying fluid G1. In some embodiments, the first drying fluid G1 may be a drying fluid in a supercritical state. For example, the first drying fluid G1 may be carbon dioxide ($CO_2$) in a supercritical state.

In some embodiments, a transfer apparatus 580 may transfer, to the second drying unit 502, the substrate on which the first drying process is performed W2. In detail, the transfer apparatus 580 may transfer, to a waiting space 590, the substrate on which the first drying process is performed W2, and then may transfer the substrate W2 to the second drying unit 502.

In detail, when the first drying process is completed, a first door 516 of the first drying unit 501 may be opened. For example, when the first drying process is completed, a first controller 571 may open the first door 516. For example, when pressure of a first inner space 518 of a first body 510 reaches a first transfer pressure after the first drying process is completed, the first controller 571 may open the first door 516. In some embodiments, when the first door 516 is opened, the transfer apparatus 580 may transfer, to the waiting space 590, the substrate on which the first drying process is performed W2.

Subsequently, a second door 517 of the second drying unit 502 may be opened. In detail, when the first drying process is completed, a second controller 572 may open the second door 517. For example, when pressure of a second inner space 519 of a second body 511 reaches a second transfer pressure after the first drying process is completed, the second controller 572 may open the second door 517. In some embodiments, when the second door 517 is opened, the transfer apparatus 580 may transfer, from the waiting space 590 to the second drying unit 502, the substrate on which the first drying process is performed W2.

In some embodiments, the second drying unit 502 may perform a second drying process on the substrate on which the first drying process is performed W2. In particular, the second drying process may use a second drying fluid G2. In some embodiments, the second drying fluid G2 may be a drying fluid in a supercritical state. For example, the second drying fluid G2 may be carbon dioxide ($CO_2$) in a supercritical state. In other words, the first drying fluid G1 and the second drying fluid G2 may include the same drying fluid.

In some embodiments, a concentration of the second drying fluid G2 within the second drying unit 502 in which the second drying process is performed may be higher than a concentration of the first drying fluid G1 within the first drying unit 501 in which the first drying process is performed. The difference between the concentrations of the first drying fluid G1 and the second drying unit G2 may occur because the substrate on which the first drying process is performed W2 is subject to the second drying process performed in the second drying unit 502, and thus, a portion of an organic solvent applied on the substrate W2 is removed rather than an organic solvent applied on the substrate W1 which is subject to the first drying process performed in the first drying unit 501. Accordingly, the first drying process may be performed within the first drying unit 501, and the substrate on which the first drying process is performed W2 may be transferred to the second drying unit 502 including a higher-concentration drying fluid, and the second drying process may be performed therein to improve drying performance of the drying processing unit 500. In addition, the second drying process may be performed by using a high-concentration drying fluid, and thus, a time taken for performing the entire drying process may be reduced. In other words, according to embodiments, a substrate processing apparatus including the drying processing unit 500 having improved drying performance may be provided.

Figure 7:
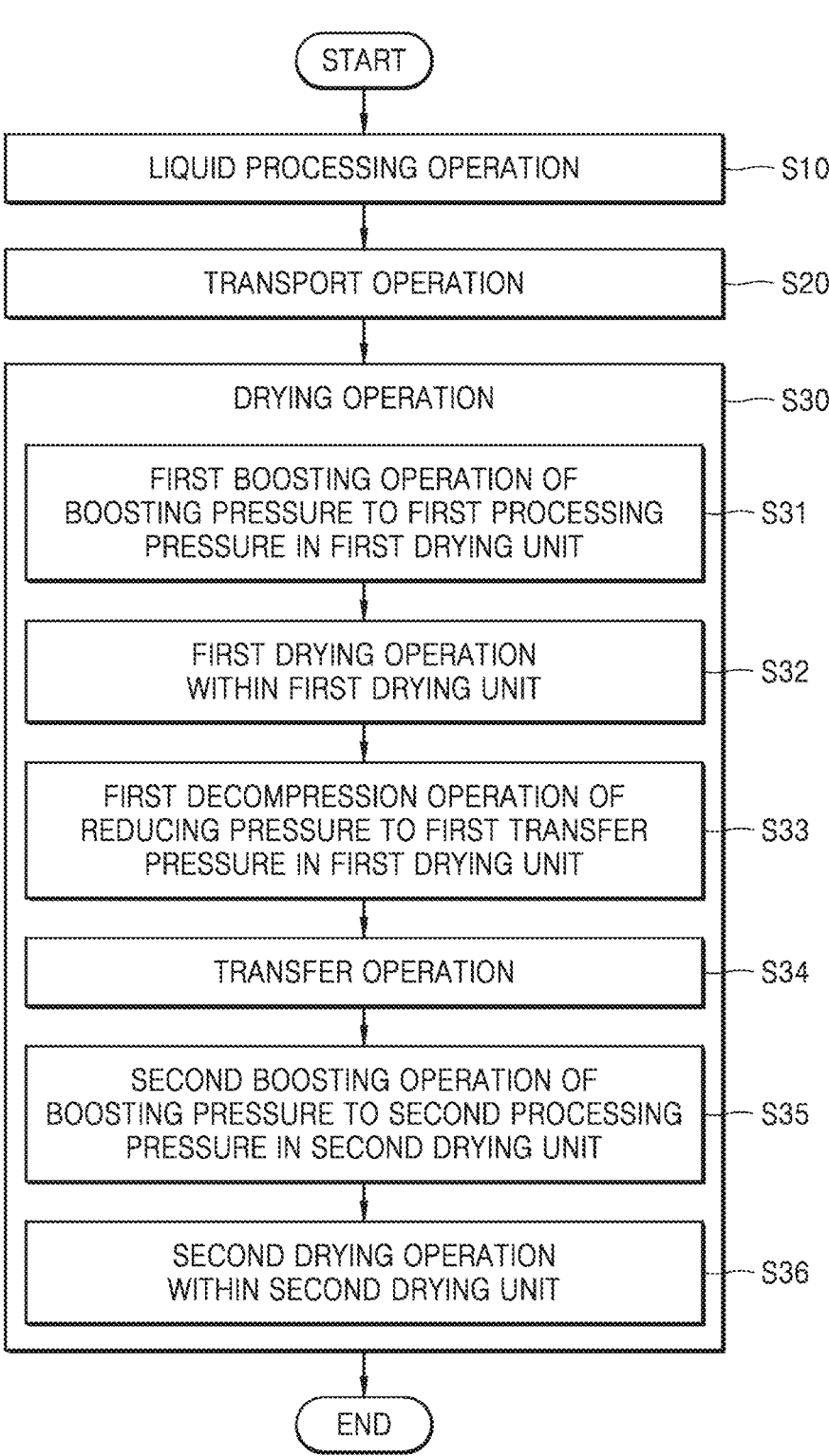
FIG. 7 is a flowchart schematically illustrating a process in which a substrate processing apparatus performs a substrate processing process, according to an embodiment.

FIG. 7 is a flowchart schematically illustrating a process in which a substrate processing apparatus performs a substrate processing process, according to an embodiment.

Figure 8A:
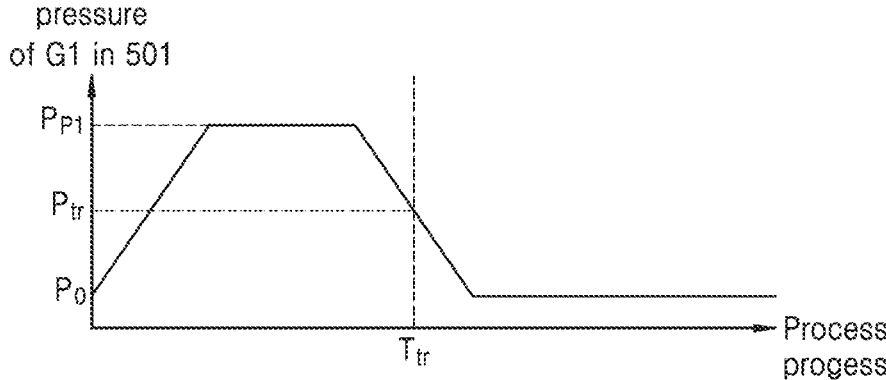
FIGS. 8A and 8B are graphs schematically illustrating a change in pressure according to process progress within some components of a substrate processing apparatus, according to an embodiment.
Figure 8B:
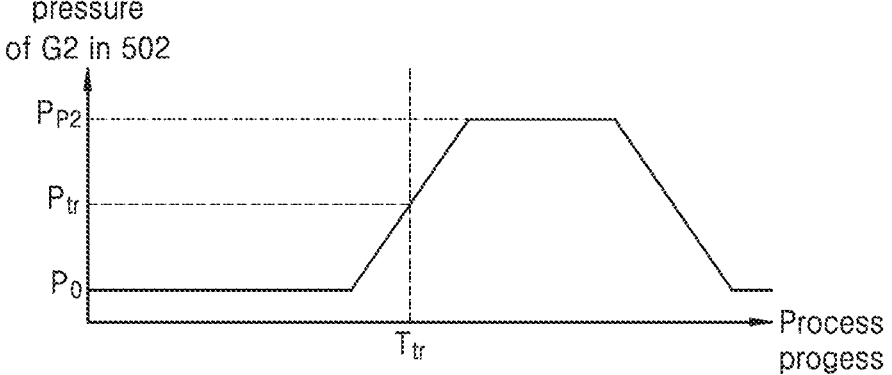

FIGS. 8A and 8B are graphs schematically illustrating a change in pressure according to process progress within some components of a substrate processing apparatus, according to an embodiment. In detail, FIG. 8A is a graph illustrating a change in pressure according to process progress within the first drying unit 501 of the drying processing unit 500 of the substrate processing apparatus, and FIG. 8B is a graph illustrating a change in pressure according to process progress within the second drying unit 502 of the drying processing unit 500 of the substrate processing apparatus. Hereinafter, the description will be given with reference to FIGS. 1 to 5 together.

Referring to FIG. 7, liquid processing operation S10 may be performed in the liquid processing unit 400. The liquid processing operation S10 may include a process of cleaning the substrate W. For example, the liquid processing operation S10 may include a process of applying a cleaning solvent and an organic solvent to the substrate W. The cleaning solvent may include a chemical and a rinse liquid. The organic solvent may include an organic solvent having low surface tension. The organic solvent may be used to perform a process of removing the cleaning solvent. For example, the organic solvent may include isopropyl alcohol (IPA).

A liquid film may be formed on the substrate on which the liquid processing operation is performed W1 in the liquid processing unit 400. In other words, the organic solvent may form the liquid film on the substrate W1.

Referring continuously to FIG. 7, the transport apparatus 300 may perform transport operation S20 of transporting the substrate W1 to the drying processing unit 500. In detail, the transport apparatus 300 may perform an operation of transporting the substrate having formed thereon the liquid film W1 to the drying processing unit 500. For example, the transport apparatus 300 may transport, to the drying processing unit 500, the substrate W1 to which the organic solvent is applied.

Referring continuously to FIG. 7, the drying processing unit 500 may perform drying operation S30 on the substrate W1. For example, the drying processing unit 500 may perform a drying processing process on the substrate W1 to which the organic solvent is applied. For example, as described with reference to FIGS. 3 to 5, a drying processing process in the first drying unit 501 and the second drying unit 502 may be performed on the substrate W1.

Referring to FIGS. 7, 8A, and 8B together, the drying operation S30 may include first boosting operation S31 of boosting pressure to a first processing pressure $P_{P1}$ in the first drying unit 501. In detail, first boosting operation S31 of boosting pressure of the first inner space 518 of the first body 510 to the first processing pressure $P_{P1}$ may be performed. In some embodiments, the first boosting operation S31 may be performed after the substrate W1 is transported to the first drying unit 501. In other words, the first boosting operation S31 may be performed while the substrate having the liquid film formed thereon W1 is arranged in the first drying unit 501. The first processing pressure $P_{P1}$ may be, for example, about 120 Bar to about 150 Bar.

In some embodiments, the first boosting operation S31 may be performed by the first fluid supply unit 530. In detail, the first drying fluid G1 may be supplied by the first fluid supply unit 530 to increase the pressure of the first inner space 518 of the first body 510. In more detail, the first drying fluid G1 may be supplied by the first fluid supply unit 530 until the pressure of the first inner space 518 of the first body 510 reaches the first processing pressure $P_{P1}$.

In some embodiments, the first boosting operation S31 may be controlled by the first controller 571. In detail, the first controller 571 may control the first fluid supply unit 530 to supply the first drying fluid G1 to the first inner space 518 of the first body 510.

Referring continuously to FIGS. 7, 8A, and 8B, when the pressure of the first inner space 518 of the first body 510 reaches the first processing pressure $P_{P1}$, first drying operation S32 may be performed. The first drying operation S32 may include a first drying operation. In some embodiments, when the pressure of the first inner space 518 of the first body 510 reaches the first processing pressure $P_{P1}$, the pressure of the first inner space 518 of the first body 510 may be maintained. In some embodiments, the first fluid supply unit 530 and/or the first fluid exhaust unit 550 may maintain the pressure of the first inner space 518 of the first body 510 at the first processing pressure $P_{P1}$.

Referring continuously to FIGS. 7, 8A, and 8B, decompression operation S33 of reducing pressure to a first transfer pressure $P_{tr1}$ may be performed within the first drying unit 501. In some embodiments, the decompression operation S33 within the first drying unit 501 may be performed after the first drying process is completed.

In some embodiments, the decompression operation S33 within the first drying unit 501 may be performed by the first fluid exhaust unit 550. In detail, the first drying fluid G1 may be exhausted by the first fluid exhaust unit 550, and thus, the pressure of the first inner space 518 of the first body 510 may decrease. In detail, the first drying fluid G1 may be exhausted by the first fluid exhaust unit 550 until the pressure of the first inner space 518 of the first body 510 reaches the first transfer pressure $P_{tr1}$.

In some embodiments, the decompression operation S33 within the first drying unit 501 may be controlled by the first controller 571. In detail, the first controller 571 may control the first fluid exhaust unit 550 to exhaust the first drying fluid G1.

Referring continuously to FIGS. 7, 8A, and 8B, a transfer operation on the substrate W2 may be performed at a transfer time $T_{tr}$. In detail, when the pressure of the first inner space 518 of the first body 510 reaches the first transfer pressure $P_{tr1}$, the first door 516 of the first drying unit 501 may be opened. When the first door 516 is opened, the transfer apparatus 580 may transfer the substrate W2 to the waiting space 590. When pressure of the second inner space 519 of the second body 511 of the second drying unit 502 reaches a second transfer pressure $P_{tr2}$, the second door 517 may be opened. When the second door 517 is opened, the transfer apparatus 580 may transfer the substrate W2 to the second drying unit 502.

In some embodiments, the transfer time $T_{tr}$ may be determined by time. In some embodiments, the transfer time $T_{tr}$ may be determined according to whether or not the pressure of the first inner space 518 of the first body 510 of the first drying unit 501 reaches the first transfer pressure $P_{tr1}$. In some embodiments, the transfer time $T_{tr}$ may be determined according to whether or not the pressure of the second inner space 519 of the second body 511 of the second drying unit 502 reaches the second transfer pressure $P_{tr2}$.

In some embodiments, the pressure of the second inner space 519 of the second body 511 of the second drying unit 502 may be boosted to the second transfer pressure $P_{tr2}$. The boosting operation may be performed, for example, while the first drying process is performed on the substrate W1 within the first drying unit 501. The boosting operation may be performed, for example, when the first drying process is completed.

In some embodiments, when the first door 516 of the first drying unit 501 is opened, pressure inside the first drying unit 501 may be the first transfer pressure $P_{tr1}$. In some embodiments, when the first door 516 of the first drying unit 501 is opened, pressure of the waiting space 590 may be greater than or equal to the first transfer pressure $P_{tr1}$. Accordingly, impurities, such as an organic solvent dried and removed within the first drying unit 501, may not move to the waiting space 590 due to a pressure difference.

In some embodiments, when the second door 517 of the second drying unit 502 is opened, pressure inside the second drying unit 502 may be the second transfer pressure $P_{tr2}$. In some embodiments, when the second door 517 of the second drying unit 502 is opened, pressure of the waiting space 590 may be less than or equal to the second transfer pressure $P_{tr2}$. Accordingly, impurities, which may be present in the waiting space 590, may not move into the second drying unit 502 due to a pressure difference.

In some embodiments, the second transfer pressure $P_{tr2}$ may be greater than or equal to the first transfer pressure $P_{tr1}$. In some embodiments, the pressure of the waiting space 590 may be kept constant. In some embodiments, the pressure of the waiting space 590 may be kept constant at pressure that is greater than or equal to the first transfer pressure $P_{tr1}$ and less than or equal to the second transfer pressure $P_{tr2}$. In some embodiments, the pressure of the waiting space 590 may be maintained at pressure that is greater than or equal to the first transfer pressure $P_{tr1}$ and less than or equal to the second transfer pressure $P_{tr2}$. Each of the first transfer pressure $P_{tr1}$ and the second transfer pressure $P_{tr2}$ may be, for example, greater than or equal to about 80 Bar or and less than about 120 Bar.

Referring continuously to FIGS. 7, 8A, and 8B, second boosting operation S35 of boosting pressure to a second processing pressure $P_{P2}$ in the second drying unit 502 may be performed. In detail, second boosting operation S35 of boosting the pressure of the second inner space 519 of the second body 511 to the second processing pressure $P_{P2}$ may be performed. In some embodiments, the second boosting operation S35 may be performed after the substrate W2 is transferred into the second drying unit 502. In other words, the second boosting operation S35 may be performed while the substrate on which the first drying process is performed W2 is arranged within the second drying unit 502. The second processing pressure $P_{P2}$ may be, for example, about 120 Bar to about 150 Bar.

In some embodiments, the second boosting operation S35 may be performed by the second fluid supply unit 522. In detail, when the second drying fluid G2 is supplied by the second fluid supply unit 532, the pressure of the second inner space 519 of the second body 511 may increase. In more detail, the second drying fluid G2 may be supplied by the second fluid supply unit 532 until the pressure of the second inner space 519 of the second body 511 reaches the second processing pressure $P_{P2}$.

In some embodiments, the second boosting operation S35 may be controlled by the second controller 572. In detail, the second controller 572 may control the second fluid supply unit 532 to supply the second drying fluid G2 to the second inner space 519 of the second body 511.

Referring continuously to FIGS. 7 and 8, when the pressure of the second inner space 519 of the second body 511 reaches the second processing pressure $P_{P2}$, second drying operation S36 may be performed. The second drying operation S36 may include the second drying process. In some embodiments, when the pressure of the second inner space 519 of the second body 511 reaches the second processing pressure $P_{P2}$, the pressure of the second inner space 519 of the second body 511 may be maintained. In some embodiments, the second fluid supply unit 532 and/or the second fluid exhaust unit 552 may maintain the pressure of the second inner space 519 of the second body 511 at the second processing pressure $P_{P2}$.

Subsequently, the pressure of the second inner space 519 of the second body 511 may decrease, and the substrate may be taken out from the drying processing unit 500.

Figure 9:
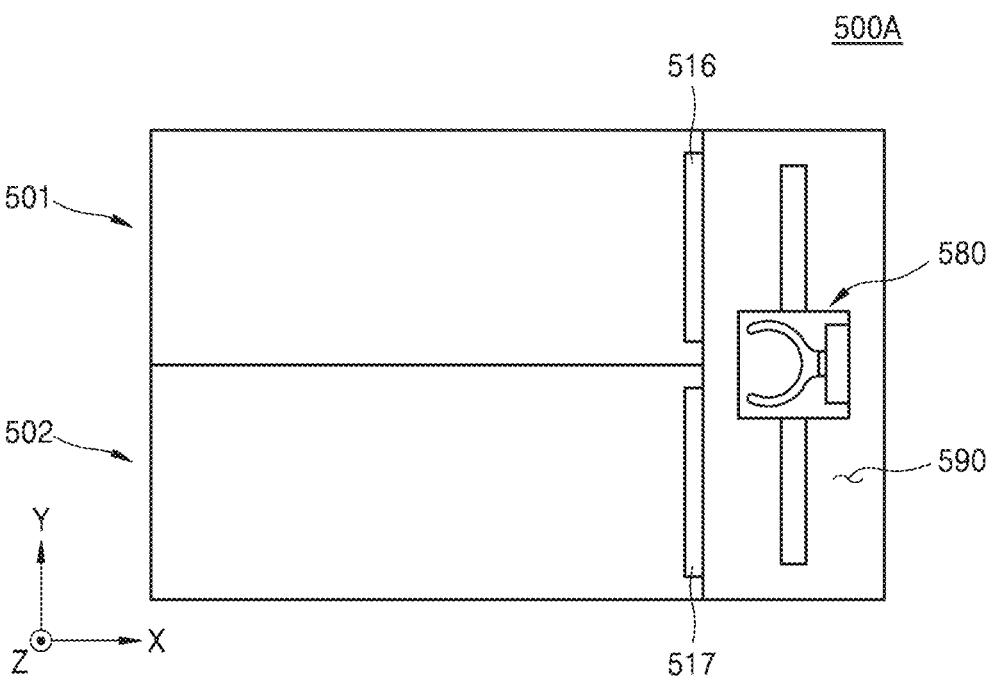
FIGS. 9 to 11 are views schematically illustrating an arrangement of some components of a drying processing unit, according to some embodiments.
Figure 10:
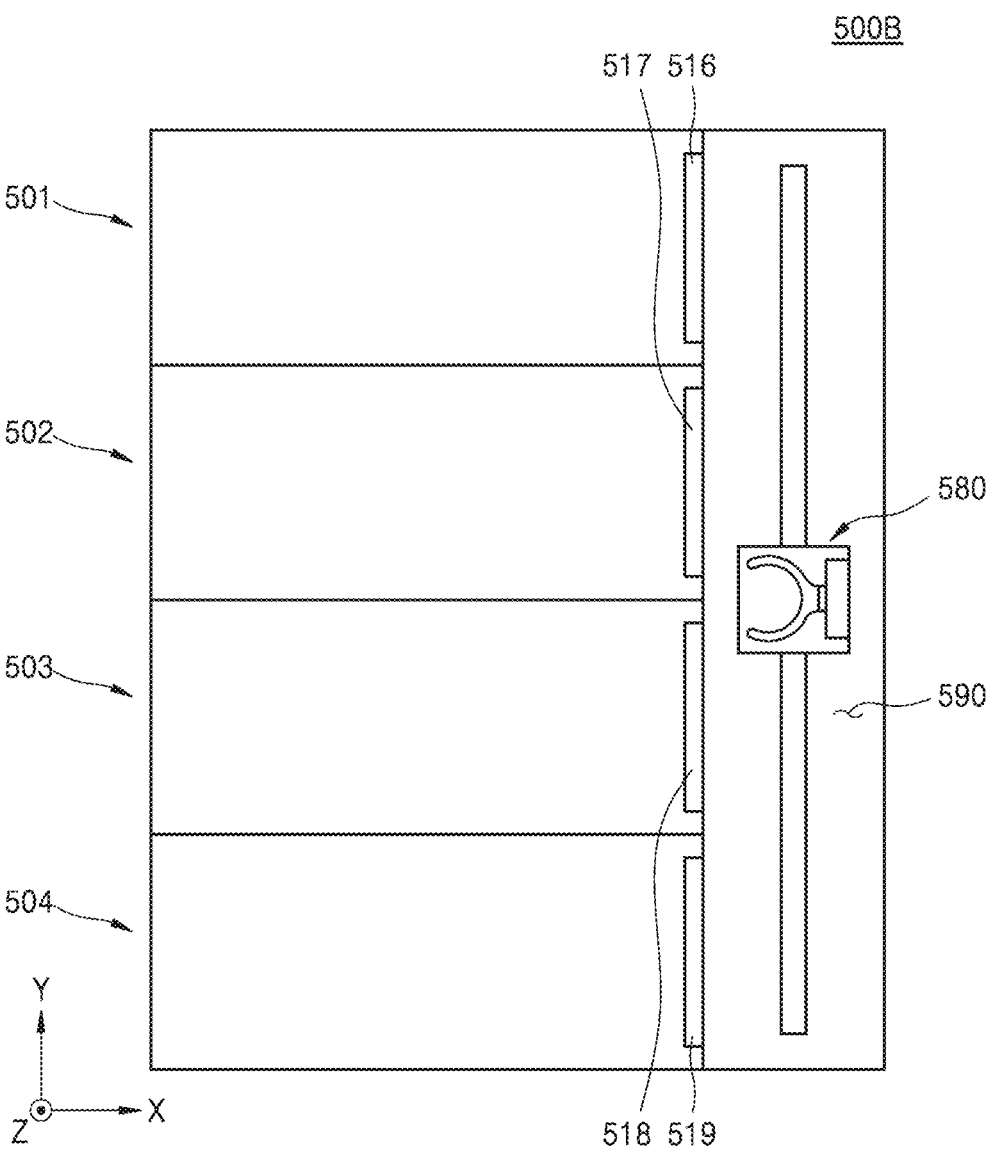
Figure 11:
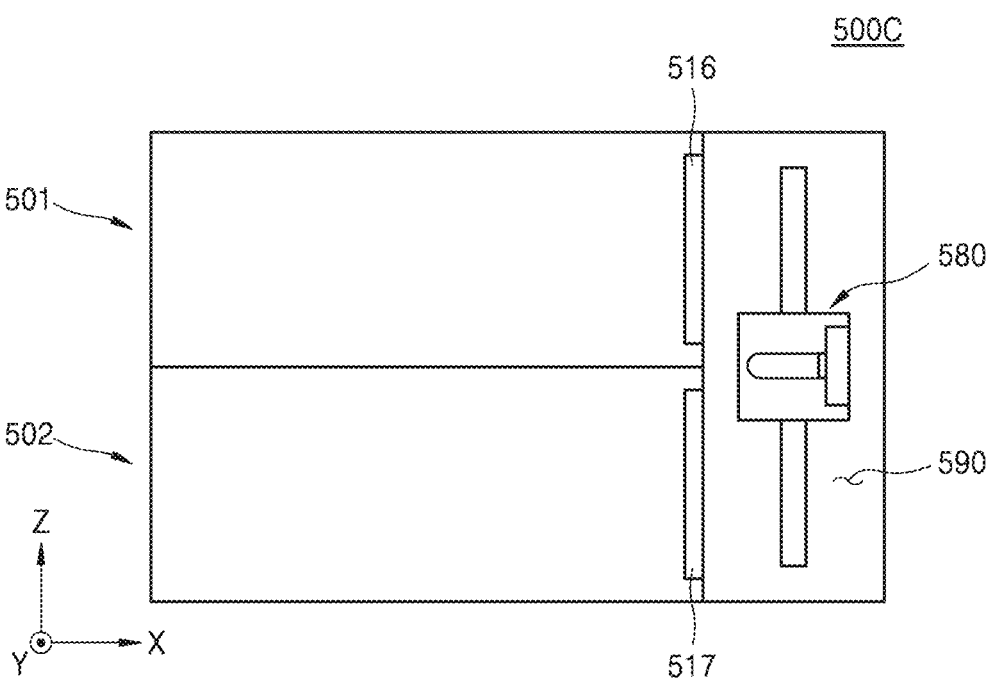

FIGS. 9 to 11 are views schematically illustrating an arrangement of some components of a drying processing unit, according to some embodiments.

Referring to FIG. 9, a drying processing unit 500A may include a first drying unit 501 and a second drying unit 502 arranged in a second direction Y. The drying processing unit 500A may further include a waiting space 590 adjacent to each of the first drying unit 501 and the second drying unit 502 in a first direction X in the same direction as the first drying unit 501 and the second drying unit 502. In other words, the waiting space 590 may not be arranged between the first drying unit 501 and the second drying unit 502.

Referring to FIG. 10, a drying processing unit 500B may include a plurality of drying units arranged in a second direction Y. In detail, the drying processing unit 500B may include first to fourth drying units 501 to 504 arranged in the second direction Y. The third drying unit 503 and the fourth drying unit 504 may include similar components to the first drying unit 501 described with reference to FIG. 4. A waiting space 590 may be arranged on one side of the first drying unit 501 to the fourth drying unit 504, and may be adjacent to each of the first drying unit 501 to the fourth drying unit 504 in a first direction X in the same direction as the same direction as the first drying unit 501 to the fourth drying unit 504.

In some embodiments, the third drying unit 503 may perform a third drying process subsequent to a second drying process. In detail, the third drying unit 503 may perform the third drying process by receiving a substrate on which the second drying process is performed in the second drying unit 502. The third drying process may use a third drying fluid. The third drying fluid may include carbon dioxide ($CO_2$).

In some embodiments, the fourth drying unit 504 may perform a fourth drying process subsequent to the third drying process. In detail, the fourth drying unit 504 may perform the fourth drying process by receiving the substrate on which the third drying process is performed in the third drying unit 503. The fourth drying process may use a fourth drying fluid. The fourth drying fluid may include carbon dioxide ($CO_2$).

In some embodiments, a transfer apparatus 580 may transfer the substrate between the first drying unit 501 to the fourth drying unit 504. In detail, the transfer apparatus 580 may transfer, from the first drying unit 501 to the second drying unit 502, the substrate on which the first drying process is performed W2. In more detail, the transfer apparatus 580 may transfer, to the third drying unit 503, the substrate on which the second drying process is performed in the second drying unit 502. In more detail, the transfer apparatus 580 may transfer, to the fourth drying unit 504, the substrate on which the third drying process is performed in the third drying unit 503.

Referring to FIG. 11, a drying processing unit 500C may include a first drying unit 501 and a second drying unit 502 arranged in a third direction Z. In other words, the first drying unit 501 and the second drying unit 502 may be vertically stacked, and a transfer apparatus 580 may transfer a substrate while moving up and down.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
   a first drying unit configured to perform a first drying process using a drying fluid on a substrate having a liquid film formed thereon, the first drying unit including a first door that is configured to open and close the first drying unit;
   a first fluid supply unit configured to supply the drying fluid into the first drying unit;
   a second drying unit configured to perform a second drying process using the drying fluid on the substrate on which the first drying process is performed, the second drying unit having a second door that is configured to open and close the second drying unit;
   a second fluid supply unit configured to supply the drying fluid into the second drying unit; and
   a controller configured to control the first door and the second door in order to transfer the substrate from the first drying unit to the second drying unit, wherein the controller is configured to control the first door to open the first door in response to pressure in the first drying unit reaching a first transfer pressure, and the controller is configured to control the second door to open the second door in response to pressure in the second drying unit reaching a second transfer pressure.

2. The substrate processing apparatus of claim 1, wherein the substrate on which the first drying process is performed is transferred through the first door and the second door.

3. The substrate processing apparatus of claim 1, further comprising a waiting space adjacent to the first drying unit and the second drying unit, wherein the first transfer pressure is lower than or equal to a waiting pressure inside the waiting space.

4. The substrate processing apparatus of claim 1, further comprising a waiting space adjacent to the first drying unit and the second drying unit, wherein the second transfer pressure is higher than or equal to a waiting pressure inside the waiting space.

5. The substrate processing apparatus of claim 1, further comprising a waiting space between the first drying unit and the second drying unit.

6. The substrate processing apparatus of claim 1, wherein the drying fluid is in a supercritical state while the first drying process and the second drying process are performed in the first drying unit and the second drying unit, respectively.

7. The substrate processing apparatus of claim 1, wherein the first transfer pressure is lower than or equal to the second transfer pressure.

8. A substrate processing apparatus comprising:
   a first drying unit configured to perform a first drying process using a drying fluid on a substrate having a liquid film formed thereon, the first drying unit including a first door that is configured to open and close the first drying unit;

a second drying unit configured to perform a second drying process using the drying fluid on the substrate on which the first drying process is performed, the second drying unit having a second door that is configured to open and close the second drying unit;

a waiting space adjacent to the first drying unit and the second drying unit;

a transfer apparatus configured to transfer, to the second drying unit, the substrate on which the first drying process is performed in the first drying unit; and a controller configured to control the first door and the second door in order to transfer the substrate from the first drying unit to the second drying unit, wherein the controller is configured to control the first door to open the first door in response to pressure in the first drying unit reaching a first transfer pressure, the controller is configured to control the second door to open the second door in response to pressure in the second drying unit reaching a second transfer pressure, and the first transfer pressure is lower than or equal to the second transfer pressure.

9. The substrate processing apparatus of claim 8, wherein the transfer apparatus is configured to:

in response to the first door being opened, transfer, to the waiting space, the substrate on which the first drying process is performed; and in response to the second door being opened, transfer, from the waiting space to the second drying unit, the substrate on which the first drying process is performed.

10. The substrate processing apparatus of claim 8, further comprising:

a first fluid supply unit configured to supply the drying fluid into the first drying unit while the first drying process is performed on the substrate; and a second fluid supply unit configured to supply the drying fluid into the second drying unit while the second drying process is performed on the substrate on which the first drying process is performed.

11. The substrate processing apparatus of claim 8, wherein pressure of the waiting space is greater than or equal to the first transfer pressure, and is lower than or equal to the second transfer pressure.

12. The substrate processing apparatus of claim 8, further comprising:

a first fluid supply unit configured to supply the drying fluid into the first drying unit; and a first fluid exhaust unit configured to exhaust the drying fluid to an outside of the first drying unit, wherein the controller is configured to control the first fluid supply unit and the first fluid exhaust unit to increase the pressure in the first drying unit to a first process pressure at which the first drying process is performed; and reduce the pressure in the first drying unit to the first transfer pressure.

13. The substrate processing apparatus of claim 12, further comprising:

a second fluid supply unit configured to supply the drying fluid into the second drying unit; and a second fluid exhaust unit configured to exhaust the drying fluid to an outside of the second drying unit, wherein the controller is configured to control the second fluid supply unit and the second fluid exhaust unit to increase the pressure in the second drying unit to the second transfer pressure; and increase the pressure in the second drying unit to a second process pressure at which the second drying process is performed.

14. A substrate processing method comprising:

cleaning a substrate;

transporting the substrate to a drying processing unit, the drying processing unit including a first drying unit configured to perform a first drying process using a drying fluid on the substrate having a liquid film formed thereon, the first drying unit including a first door that is configured to open and close the first drying unit;

a first fluid supply unit configured to supply the drying fluid into the first drying unit;

a second drying unit configured to perform a second drying process using the drying fluid on the substrate on which the first drying process is performed, the second drying unit having a second door that is configured to open and close the second drying unit;

a second fluid supply unit configured to supply the drying fluid into the second drying unit; and a controller configured to control the first door and the second door in order to transfer the substrate from the first drying unit to the second drying unit; and drying the substrate, wherein the drying the substrate includes boosting pressure in the first drying unit to a first processing pressure;

performing the first drying process on the substrate in the first drying unit at the first processing pressure by using the drying fluid;

reducing pressure in the first drying unit to a first transfer pressure;

controlling, using the controller, the first door of the first drying unit to open the first door in response the pressure in the first drying unit reaching the first transfer pressure;

controlling, using the controller, the second door of the second drying unit to open the second door in response to the pressure in the second drying unit reaching a second transfer pressure;

transferring, from the first drying unit to the second drying unit, the substrate on which the first drying process is performed;

boosting the pressure in the second drying unit to a second processing pressure; and performing, in the second drying unit at the second processing pressure, the second drying process on the substrate on which the first drying process is performed, by using the drying fluid.

15. The substrate processing method of claim 14, further comprising boosting the pressure in the second drying unit to the second transfer pressure in order to perform the transferring.

16. The substrate processing method of claim 15, wherein the first transfer pressure in the first drying unit is lower than or equal to the second transfer pressure in the second drying unit.

17. The substrate processing method of claim 14, further comprising a waiting space adjacent to the first drying unit and the second drying unit, wherein the transferring includes:

transferring, from the first drying unit to the waiting space, the substrate on which the first drying process is performed; and transferring, from the waiting space to the second drying unit, the substrate on which the first drying process is performed.

18. The substrate processing method of claim 14, wherein the cleaning the substrate includes applying an organic solvent onto the substrate, wherein the organic solvent includes isopropyl alcohol (IPA), the drying fluid includes carbon dioxide ($CO_2$), and the first transfer pressure in the first drying unit and the second transfer pressure in the second drying unit are each about 80 Bar to about 100 Bar.

\* \* \* \* \*